United States Patent
Ko

(10) Patent No.: US 9,911,680 B2
(45) Date of Patent: Mar. 6, 2018

(54) BIDIRECTIONAL SEMICONDUCTOR PACKAGE

(71) Applicant: HYUNDAI MOBIS Co., Ltd., Yongin-si, Gyeonggi-do (KR)

(72) Inventor: Jae Hyun Ko, Yongin-si (KR)

(73) Assignee: HYUNDAI MOBIS Co., Ltd., Yongin-si (KR)

(*) Notice: Subject to any disclaimer, the term of this patent is extended or adjusted under 35 U.S.C. 154(b) by 0 days.

(21) Appl. No.: 15/470,648

(22) Filed: Mar. 27, 2017

(65) Prior Publication Data

US 2017/0301606 A1 Oct. 19, 2017

(30) Foreign Application Priority Data

Apr. 19, 2016 (KR) .................. 10-2016-0047483

(51) Int. Cl.

| | |
|---|---|
| *H01L 23/34* | (2006.01) |
| *H01L 23/373* | (2006.01) |
| *H01L 23/14* | (2006.01) |
| *H01L 23/15* | (2006.01) |
| *H01L 23/482* | (2006.01) |
| *H01L 23/49* | (2006.01) |
| *H01L 23/492* | (2006.01) |
| *H01L 23/495* | (2006.01) |

(52) U.S. Cl.
CPC ........ *H01L 23/3736* (2013.01); *H01L 23/142* (2013.01); *H01L 23/15* (2013.01); *H01L 23/4827* (2013.01); *H01L 23/49* (2013.01); *H01L 23/495* (2013.01); *H01L 23/4924* (2013.01); *H01L 23/49582* (2013.01)

(58) Field of Classification Search
CPC ... H01L 23/3736; H01L 23/142; H01L 23/15; H01L 23/4827; H01L 23/49; H01L 23/4924; H01L 23/495; H01L 23/49582
USPC .......................................................... 257/713
See application file for complete search history.

(56) References Cited

U.S. PATENT DOCUMENTS

| | | | |
|---|---|---|---|
| 8,654,541 B2* | 2/2014 | Robert | H01L 23/3735 |
| | | | 361/760 |
| 9,059,145 B2* | 6/2015 | Kadoguchi | H01L 23/051 |
| 9,704,819 B1* | 7/2017 | Gao | H01L 25/50 |

* cited by examiner

*Primary Examiner* — Luan C Thai
(74) *Attorney, Agent, or Firm* — Knobbe Martens Olson & Bear LLP

(57) ABSTRACT

Provided is a bidirectional semiconductor package in which the number of processes for manufacturing the bidirectional semiconductor package is reduced. According to present application, a portion between one end and the other end of the buffer wire is in contact with the lower surface of the upper DBC substrate and heat generated by the semiconductor chip is transferred to the upper DBC substrate.

7 Claims, 1 Drawing Sheet

BIDIRECTIONAL SEMICONDUCTOR PACKAGE

CROSS-REFERENCE TO RELATED APPLICATION

This application claims priority to and the benefit of Korean Patent Application No. 10-2016-0047483, filed on Apr. 19, 2016, the disclosure of which is incorporated herein by reference in its entirety.

BACKGROUND

1. Field of the Invention

The present invention relates to a bidirectional semiconductor package, and more particularly, to a bidirectional semiconductor package in which the number of processes for manufacturing the bidirectional semiconductor package is reduced.

2. Discussion of Related Art

Generally, in the semiconductor industry, there is a trend for products to become more lightweight, compact, versatile, and have higher-performance at a low cost.

An integrated circuit (IC) package technique is one important technique required to meet this trend.

The IC package protects a semiconductor chip such as a single element and an IC device in which various electronic circuits and wirings are stacked from various external environmental factors such as dust, moisture, electrical load, mechanical load, and the like.

In addition, the IC package refers to a package in which a signal input-and-output terminal is formed on a main board using a lead frame, a printed circuit board (PCB), or the like and is molded using an encapsulant in order to optimize and maximize electrical performance of the semiconductor chip.

Meanwhile, recently, since products on which an IC package is mounted have become lightweight, short, and small and require many functions, a method such as a system in package (SiP) in which a plurality of semiconductor chips are mounted in an IC package, a package on package (PoP), or the like has been applied as the IC package technique.

In addition, the fact that a thickness of a PCB on which highly integrated and ultra-thinned parts are mounted should also be reduced has become a challenge.

A degree of freedom in a circuit design of a substrate should be increased to satisfy these requirements, and solving such a problem by applying various new techniques such as micro-vias, build-ups, and the like has been attempted.

Meanwhile, among various substrates, since a ceramic substrate is formed using a ceramic as a base material unlike a general PCB, the ceramic substrate has a characteristic of being able to withstand at high temperature and high current.

Due to this characteristic, the ceramic substrate is mainly used for a power semiconductor, an insulated-gate bipolar transistor (IGBT), a high power light-emitting diode (LED), a solar cell module, and the like.

Such a ceramic substrate, and particularly, a direct bonded copper (DBC) substrate, is used for a relatively high-voltage product.

Recently, an electronic device requires a large number of semiconductors due to a multifunctional and high performance trend, and accordingly, a high temperature is generated and a higher heat dissipation efficiency of the semiconductor package is required.

Therefore, conventionally, DBC substrates are stacked in upward and downward directions to further increase a heat dissipation efficiency of a semiconductor package, and thus the heat dissipation effect of the semiconductor package is increased by dissipating heat in both directions.

A conventional bidirectional semiconductor package includes a lower DBC substrate 10, an upper DBC substrate 20, a semiconductor chip 30, a spacer member 40, and a wire 50 as illustrated in FIG. 1.

In the conventional bidirectional semiconductor package, the semiconductor chip 30 is mounted on an upper surface of the lower DBC substrate 10, and the wire 50 is bonded to an upper surface of the mounted semiconductor chip 30.

Next, solder is applied to a remaining region other than a region of the upper surface of the semiconductor chip 30 to which the wire 50 is bonded, and the spacer member 40 is mounted on an upper surface of the solder.

Further, the upper DBC substrate 20 is mounted on an upper surface of the spacer member 40 and is molded using an encapsulant after the above process.

Accordingly, the lower DBC substrate 10 and the upper DBC substrate 20 may be electrically connected to each other, and a heat dissipation effect of the bidirectional semiconductor package may be further increased.

However, since contact areas between the DBC substrates 10 and 20 and the spacer member 40 are large, there is a problem in that an air layer is generated on a bottom surface of the semiconductor chip 30 due to soldering when manufacturing the bidirectional semiconductor package and a lifetime of the semiconductor package is reduced.

Further, in the conventional bidirectional semiconductor package, there is a problem in that an overall soldering thickness thereof is not uniform and the semiconductor chip 30 or the DBC substrates 10 and 20 are broken or a molding member is separated therefrom in the process of manufacturing the bidirectional semiconductor package.

Further, conventionally, the spacer member 40 includes a first spacer member 41 which connects the semiconductor chip 30 to the upper DBC substrate 20 and a second spacer member 42 which supports the upper DBC substrate 20 and the lower DBC substrate 10. Since a process of respectively soldering the first spacer member 41 and the second spacer member 42 to the lower DBC substrate 10 and the upper DBC substrate 20 accounts for a high percentage of a total process time, there is a problem in that a yield is lowered and a cost is increased.

SUMMARY OF THE INVENTION

The present invention is directed to a heat generating portion which is soldered onto a substrate and has a small contact area with the substrate.

According to an aspect of the present invention, there is provided a bidirectional semiconductor package including a lower direct bonded copper (DBC) substrate including a first base made of a ceramic and a first pattern layer bonded to an upper surface and a lower surface of the first base, a lead frame mounted on an upper surface of the lower DBC substrate, a semiconductor chip mounted on an upper surface of the lead frame, an upper DBC substrate including a second base made of a ceramic and a second pattern layer bonded to an upper surface and a lower surface of the second base, wherein the upper DBC substrate is spaced in an upward direction from the lower DBC substrate, a buffer layer having one end soldered onto a lower surface of the upper DBC substrate and the other end soldered onto an upper surface of a remaining region other than a region of the upper surface of the lead frame on which the semiconductor chip is mounted, wherein the buffer layer supports a gap between the lower DBC substrate and the upper DBC substrate, a buffer wire spaced in a lateral direction from the buffer layer and having one end soldered onto an upper surface of a region located in one direction of the semiconductor chip and the other end soldered onto an upper surface of a region located in the other direction of the semiconductor chip, and a conductive wire configured to electrically connect the upper surface of the lower DBC substrate to the semiconductor chip. A portion between the one end and the other end of the buffer wire is in contact with the lower surface of the upper DBC substrate and heat generated by the semiconductor chip is transferred to the upper DBC substrate.

At least one inflection point which is bent in a direction of the upper DBC substrate and at least one inflection point which is bent in a direction of the lower DBC substrate may be continuously formed between the one end and the other end of the buffer wire, and the inflection point of a bent portion, which is bent from the upper DBC substrate toward the lower DBC substrate, may be in contact with the lower surface of the upper DBC substrate.

The buffer wire may include a ribbon-type metal wire or a tape-type metal wire.

The first pattern layer and the second pattern layer may be made of copper.

The semiconductor chip may include a power semiconductor chip.

The package may further include a molding portion configured to surround the lower DBC substrate and the upper DBC substrate and configured to protect the lower DBC substrate, the upper DBC substrate, and various electronic components disposed between the lower DBC substrate and the upper DBC substrate.

The molding portion may be molded with an epoxy molding compound (EMC).

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Advantages and features of the present invention and methods of achieving the same should be clearly understood with reference to the accompanying drawings and the following detailed embodiments. However, the present invention is not limited to the embodiments to be disclosed below, and may be implemented in various different forms. The embodiments are provided in order to fully explain the present invention and fully explain the scope of the present invention to those skilled in the art. The scope of the present invention is defined by the appended claims. Meanwhile, the terms used herein are provided only to describe embodiments of the present invention and not for purposes of limitation. Unless the context clearly indicates otherwise, singular forms include plural forms. It should be understood that the terms "comprise" and/or "comprising" specify the stated components, steps, operations and/or elements when used herein, but do not preclude the presence or addition of one or more other components, steps, operations and/or elements.

Hereinafter, embodiments of the present invention will be described in detail with reference to the accompanying drawings.

Figure 1:
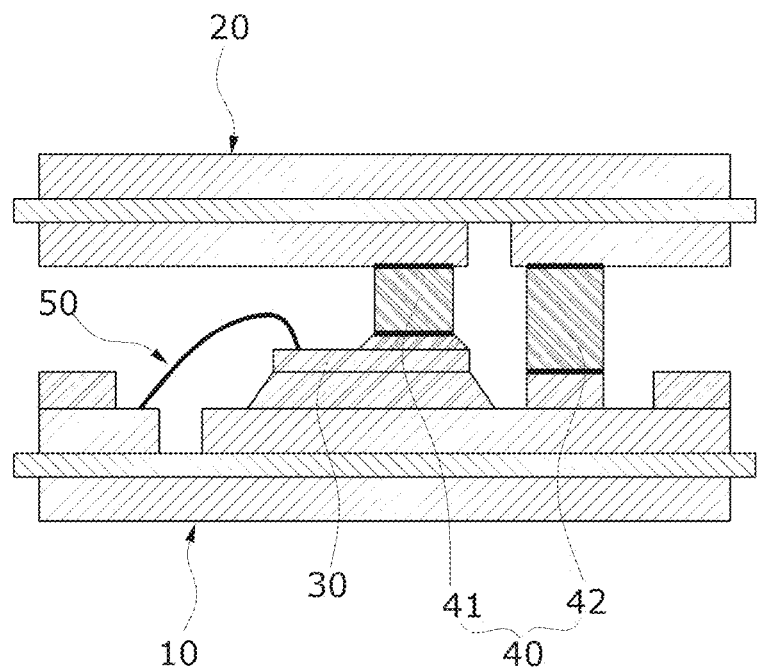
FIG. 1 is a cross-sectional view illustrating a conventional bidirectional semiconductor package.
Figure 2:
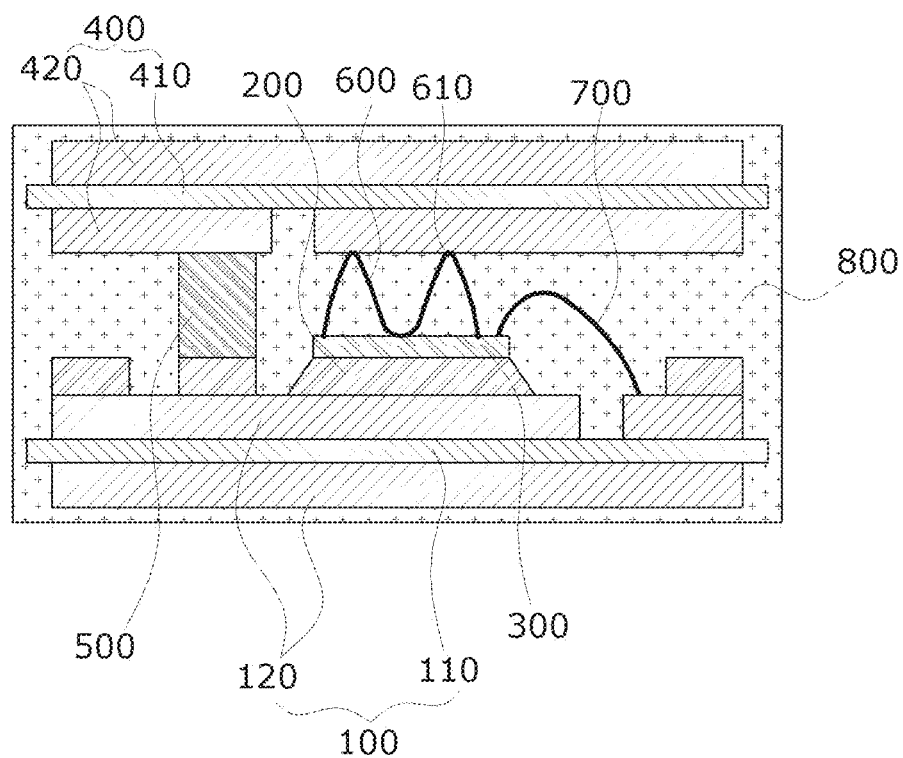
FIG. 2 is a cross-sectional view illustrating a bidirectional semiconductor package according to one embodiment of the present invention.

FIG. 2 is a cross-sectional view illustrating a bidirectional semiconductor package according to one embodiment of the present invention.

Referring to FIG. 2, the bidirectional semiconductor package according to the present embodiment includes a lower direct bonded copper (DBC) substrate 100, a lead frame 200, a semiconductor chip 300, an upper DBC substrate 400, a buffer layer 500, a buffer wire 600, a conductive wire 700, and a molding portion 800.

The lower DBC substrate 100 has a higher heat dissipation efficiency than a case in which the lead frame 200, which is made of an insulating material, is placed on a surface of a conventional heat dissipation material.

The lower DBC substrate 100 includes a first base 110 and a first pattern layer 120.

The first base 110 is a plate made of a ceramic, and more particularly, is formed of alumina ($Al_2O_3$), aluminum nitride (AlN), or the like, which is an insulating material.

The first pattern layer 120 is bonded to an upper surface and a lower surface of the first base 110 and is made of copper or a copper alloy.

The lower DBC substrate 100 having such a structure has much higher heat dissipation efficiency than a general substrate.

Further, since the first pattern layer 120, which is made of copper or a copper alloy, is bonded to the upper surface and the lower surface of the first base 110 of the lower DBC substrate 100, soldering or wire bonding may be performed thereon.

The lead frame 200 is formed by patterning lead terminals on a metal frame to maximize electrical performance of the semiconductor chip 300 and is mounted on a region, on which the semiconductor chip 300 is mounted, on an upper surface of the lower DBC substrate 100.

The entire lead frame 200 may be plated, and a plating material may include nickel, copper, or other metals.

The semiconductor chip 300 is mounted on an upper surface of the lead frame 200 by performing soldering or applying conductive epoxy thereon.

The semiconductor chip 300 includes a power semiconductor chip 300.

Recently, a design of electronic devices has been diversified according to a trend of multi-function and high performance of electronic devices, and thus the number of the semiconductor chips 300 may be changed according to a design of an electronic device.

The upper DBC substrate 400 has a higher heat dissipation efficiency than a case in which the alumina lead frame 200, which is made of an insulating material, is placed on a surface of a conventional heat dissipation material.

The upper DBC substrate 400 includes a second base 410 and a second pattern layer 420.

The second base 410 is a plate made of a ceramic, and more particularly, is formed of alumina ($Al_2O_3$), aluminum nitride (AlN), or the like, which is an insulating material.

The second pattern layer 420 is bonded to an upper surface and a lower surface of the second base 410 and is made of copper or a copper alloy.

The upper DBC substrate 400 having such a structure has the same structure and characteristic as those of the above-described lower DBC substrate 100 and is spaced in an upward direction from the lower DBC substrate 100.

Therefore, since the bidirectional semiconductor package according to one embodiment of the present invention includes the lower DBC substrate 100 and the upper DBC substrate 400, high heat of the semiconductor package requiring a large number of semiconductors may be efficiently dissipated.

One end of the buffer layer 500 is soldered onto a lower surface of the upper DBC substrate 400 and the other end thereof is soldered onto an upper surface of a remaining region other than a region of the upper surface of the lead frame 200 on which the semiconductor chip 300 is mounted.

Accordingly, the buffer layer 500 may firmly support a gap between the lower DBC substrate 100 and the upper DBC substrate 400.

Further, since the buffer layer 500 firmly supports the gap between the lower DBC substrate 100 and the upper DBC substrate 400, an overall thickness of the bidirectional semiconductor package according to one embodiment of the present invention may be uniformly maintained.

Further, the buffer layer 500 blocks a path of heat transmitted from the outside to the semiconductor chip 300 so that the semiconductor chip 300 is not damaged by the heat.

The buffer layer 500 is preferably made of a phase-change material (PCM).

The PCM is known to have a characteristic in which surrounding energy is accumulated for a predetermined time during a phase conversion process and is then re-emitted when the amount of energy is greater than a storage capacity of the PCM.

Since the bidirectional semiconductor package according to one embodiment of the present invention includes the buffer layer 500 having such characteristics, heat generated when continuously performing the process of manufacturing the semiconductor package may be smoothly discharged to the outside.

The buffer wire 600 is spaced in a lateral direction from the buffer layer 500. One end of the buffer wire 600 is soldered onto an upper surface of a region located in one direction of the semiconductor chip 300 and the other end thereof is soldered onto an upper surface of a region located in the other direction of the semiconductor chip 300.

The buffer wire 600 may include either a ribbon-type metal wire or a tape-type metal wire.

Therefore, since the buffer wire 600 is formed in a wire shape, an area of a cross section of the buffer wire 600, which is in contact with an upper surface of the semiconductor chip 300, may be small, an air layer may be prevented from being generated on a thin surface of the semiconductor chip 300 due to soldering, and thus a lifetime of the bidirectional semiconductor package according to one embodiment of the present invention can be increased.

Further, since the buffer wire 600 is formed in the wire shape, a soldering thickness can be uniform, and thus the semiconductor chip 300, the upper DBC substrate 400, or the lower DBC substrate 100 can be prevented from being broken or a molding member can be prevented from being delaminated therefrom in the process of manufacturing the bidirectional semiconductor package. At least one inflection point 610, which is bent in a direction of the upper DBC substrate 400 and at least one inflection point 610, which is bent in a direction of the lower DBC substrate 100, are continuously formed between the one end and the other end of the buffer wire 600.

Meanwhile, the inflection point 610 of a bent portion, which is bent from the upper DBC substrate 400 toward the lower DBC substrate 100, is in contact with the lower surface of the upper DBC substrate 400.

Therefore, since the buffer wire 600 may easily transfer heat which is generated by the semiconductor chip 300 to the upper DBC substrate 400, the heat generated by the semiconductor chip 300 can be efficiently dissipated.

Further, since the one end and the other end of the buffer wire 600, that is, two places, are soldered onto the upper surface of the semiconductor chip 300, the number of processes for manufacturing the bidirectional semiconductor package according to one embodiment of the present invention can be reduced, and thus a defect rate caused by a complicated process can be reduced.

The conductive wire 700 electrically connects the upper surface of the lower DBC substrate 100 to the semiconductor chip 300.

The conductive wire 700 may be formed of gold, aluminum, copper, or the like.

The molding portion 800 serves to seal and protect the lower DBC substrate 100, the upper DBC substrate 400, and various electronic components disposed between the lower DBC substrate 100 and the upper DBC substrate 400 by surrounding the lower DBC substrate 100 and the upper DBC substrate 400.

The molding portion 800 may be molded with an epoxy mold compound (EMC).

As described above, in the bidirectional semiconductor package according to the present invention, since the buffer layer 500 firmly supports the gap between the lower DBC substrate 100 and the upper DBC substrate 400, an overall thickness of the bidirectional semiconductor package may be uniformly maintained.

In addition, since the buffer wire 600 is formed to have a wire-shaped cross section, an area of the cross section in contact with the upper surface of the semiconductor chip 300 may be small, an air layer may be prevented from being generated on a thin surface of the semiconductor chip 300 due to soldering, and thus a lifetime of the bidirectional semiconductor package may be increased.

Further, since the buffer wire 600 is formed to have a wire-shaped cross section, a soldering thickness may be uniform, and thus the semiconductor chip 300, the upper DBC substrate 400, or the lower DBC substrate 100 may be prevented from being broken or a molding member may be prevented from being delaminated therefrom in the process of manufacturing the bidirectional semiconductor package.

In addition, since the inflection point 610 of a bent portion, which is bent from the upper DBC substrate 400 toward the lower DBC substrate 100, is in contact with a lower surface of the upper DBC substrate 400, heat generated by the semiconductor chip 300 may be easily transferred to the upper DBC substrate 400, and as a result, the heat generated by the semiconductor chip 300 may be efficiently dissipated.

Further, since the one end and the other end of the buffer wire 600, that is, two places, are soldered onto the upper surface of the semiconductor chip 300, the number of processes of manufacturing the bidirectional semiconductor package can be reduced and thus a defect rate caused by complicated processes can be reduced.

In the bidirectional semiconductor package according to the present invention, since a buffer layer firmly supports a gap between a lower DBC substrate and upper DBC substrate, an overall thickness of the bidirectional semiconductor package can be uniformly maintained.

In addition, since the buffer wire is formed to have a wire-shaped cross section, an area of the cross section in contact with an upper surface of a semiconductor chip can be small, an air layer can be prevented from being generated on the thin surface of the semiconductor chip due to soldering, and thus a lifespan of the bidirectional semiconductor package can be increased.

Further, since the buffer wire is formed to have a wire-shaped cross section, a soldering thickness can be uniform, and thus the semiconductor chip, the upper DBC substrate, or the lower DBC substrate can be prevented from being broken or a molding member can be prevented from being delaminated therefrom in the process of manufacturing the bidirectional semiconductor package.

In addition, since the inflection point of the bent portion, which is bent from the upper DBC substrate toward the lower DBC substrate, is in contact with the lower surface of the upper DBC substrate, heat generated by the semiconductor chip can be easily transferred to the upper DBC substrate, and thus the heat generated by the semiconductor chip can be efficiently dissipated.

Further, since one end and the other end of the buffer wire, that is, two places, are soldered onto the upper surface of the semiconductor chip, the number of processes for manufacturing the bidirectional semiconductor package can be reduced, and thus a defect rate caused by a complicated process can be reduced.

The present invention is not limited to the above-described embodiment and may be embodied in various ways within the scope of the present invention.

What is claimed is:

1. A bidirectional semiconductor package comprising:
   a lower direct bonded copper (DBC) substrate including a first base made of a ceramic and a first pattern layer bonded to an upper surface and a lower surface of the first base;
   a lead frame mounted on an upper surface of the lower DBC substrate;
   a semiconductor chip mounted on an upper surface of the lead frame;
   an upper DBC substrate including a second base made of a ceramic and a second pattern layer bonded to an upper surface and a lower surface of the second base, wherein the upper DBC substrate is spaced in an upward direction from the lower DBC substrate;
   a buffer layer having one end soldered onto a lower surface of the upper DBC substrate and the other end soldered onto an upper surface of a remaining region other than a region of the upper surface of the lead frame on which the semiconductor chip is mounted, wherein the buffer layer supports a gap between the lower DBC substrate and the upper DBC substrate;
   a buffer wire spaced in a lateral direction from the buffer layer and having one end soldered onto an upper surface of a region located in one direction of the semiconductor chip and the other end soldered onto an upper surface of a region located in the other direction of the semiconductor chip; and
   a conductive wire configured to electrically connect the upper surface of the lower DBC substrate to the semiconductor chip,
   wherein a portion between the one end and the other end of the buffer wire is in contact with the lower surface of the upper DBC substrate and heat generated by the semiconductor chip is transferred to the upper DBC substrate.

2. The bidirectional semiconductor package of claim 1, wherein:
   at least one inflection point which is bent in a direction of the upper DBC substrate and at least one inflection point which is bent in a direction of the lower DBC substrate are continuously formed between the one end and the other end of the buffer wire; and
   the inflection point of a bent portion, which is bent from the upper DBC substrate toward the lower DBC substrate, is in contact with the lower surface of the upper DBC substrate.

3. The bidirectional semiconductor package of claim 1, wherein the buffer wire includes a ribbon-type metal wire or a tape-type metal wire.

4. The bidirectional semiconductor package of claim 1, wherein the first pattern layer and the second pattern layer are made of copper.

5. The bidirectional semiconductor package of claim 1, wherein the semiconductor chip includes a power semiconductor chip.

6. The bidirectional semiconductor package of claim 1, further comprising a molding portion configured to surround the lower DBC substrate and the upper DBC substrate and configured to protect the lower DBC substrate, the upper DBC substrate, and various electronic components disposed between the lower DBC substrate and the upper DBC substrate.

7. The bidirectional semiconductor package of claim 6, wherein the molding portion is molded with an epoxy molding compound (EMC).

* * * * *